US007259400B1

(12) United States Patent
Taskar

(10) Patent No.: US 7,259,400 B1
(45) Date of Patent: *Aug. 21, 2007

(54) NANOCOMPOSITE PHOTONIC STRUCTURES FOR SOLID STATE LIGHTING

(75) Inventor: Nikhil R. Taskar, Scarsdale, NY (US)

(73) Assignee: Nanocrystal Lighting Corporation, Briarcliff Manor, NY (US)

( * ) Notice: Subject to any disclaimer, the term of this patent is extended or adjusted under 35 U.S.C. 154(b) by 41 days.

This patent is subject to a terminal disclaimer.

(21) Appl. No.: 10/842,399

(22) Filed: May 10, 2004

Related U.S. Application Data

(63) Continuation-in-part of application No. 10/299,410, filed on Nov. 19, 2002, now Pat. No. 6,734,465.

(60) Provisional application No. 60/331,683, filed on Nov. 19, 2001, provisional application No. 60/379,726, filed on May 10, 2002.

(51) Int. Cl.
*H01L 33/00* (2006.01)
(52) U.S. Cl. .............................. 257/98; 257/79; 257/88; 257/89; 257/99; 313/467; 313/485; 313/502
(58) Field of Classification Search ................ None
See application file for complete search history.

(56) References Cited

U.S. PATENT DOCUMENTS

| 5,534,718 A | * | 7/1996 | Chang .......................... 257/98 |
| 5,777,433 A | | 7/1998 | Lester |
| 6,066,861 A | * | 5/2000 | Hohn et al. .................... 257/99 |
| 6,245,259 B1 | | 6/2001 | Hohn |
| 6,417,019 B1 | | 7/2002 | Mueller |
| 6,617,401 B2 | * | 9/2003 | Rubinsztajn ................ 525/533 |
| 6,734,465 B1 | * | 5/2004 | Taskar et al. ................. 257/80 |

\* cited by examiner

*Primary Examiner*—Wai-Sing Louie
(74) *Attorney, Agent, or Firm*—William L. Botjer

(57) ABSTRACT

A photonic structure for "white" light generation by phosphors under the excitation of a LED. The photonic structure mounts the LED and an optically transparent nanocomposite matrix having dispersed therein phosphors which will emit light under the excitation of the radiation of the LED. The phosphors dispersed in the matrix may be nanocrystalline, or larger sized with the addition of non light emitting, non light scattering nanoparticles dispersed within the matrix material so as to match the index of refraction of the matrix material to that of the phosphors. The nanocomposite matrix material may be readily formed by molding and formed into a variety of shapes including lenses for focusing the emitted light. A large number of the photonic structures may be arranged on a substrate to provide even illumination or other purposes.

24 Claims, 9 Drawing Sheets

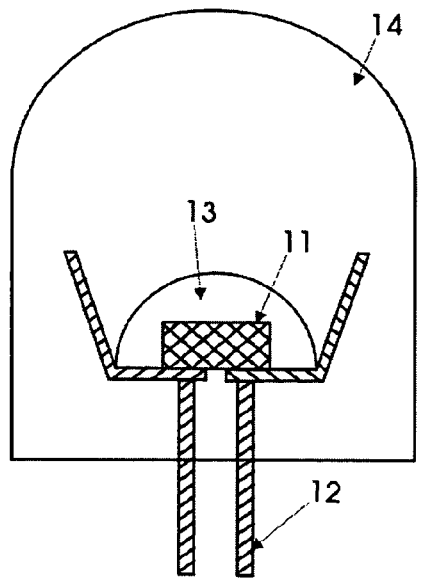 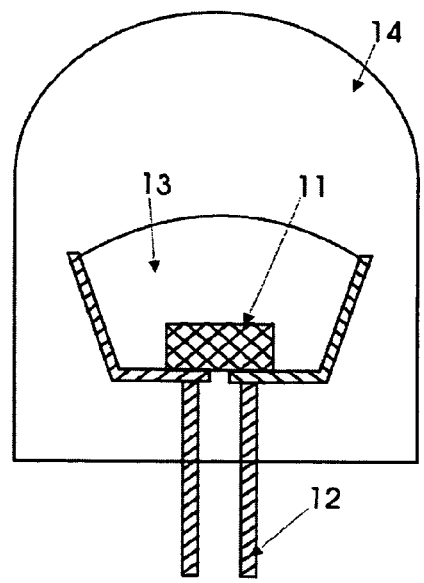
Figs 2
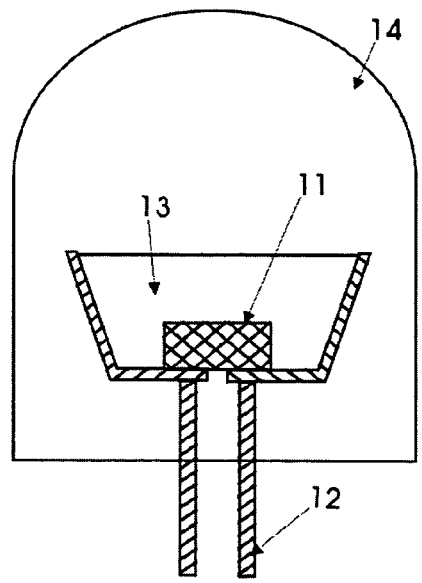 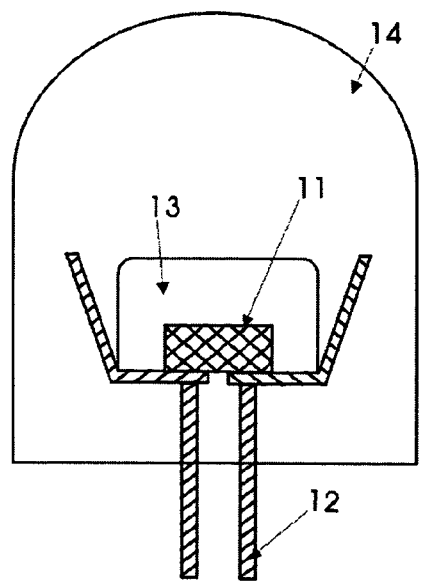

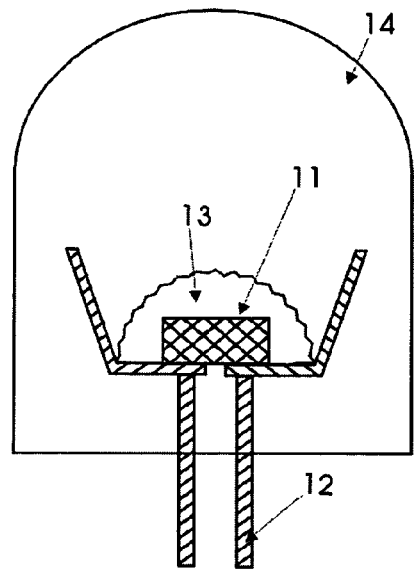
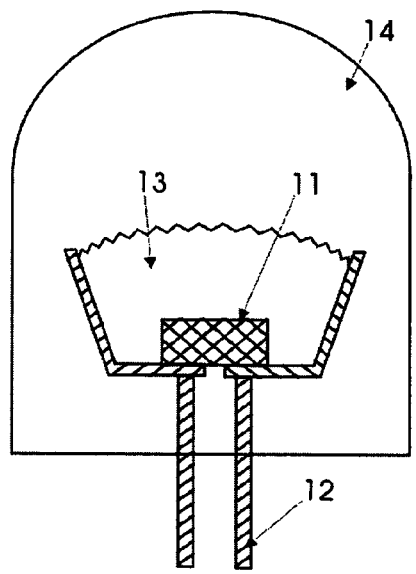
Figs 3
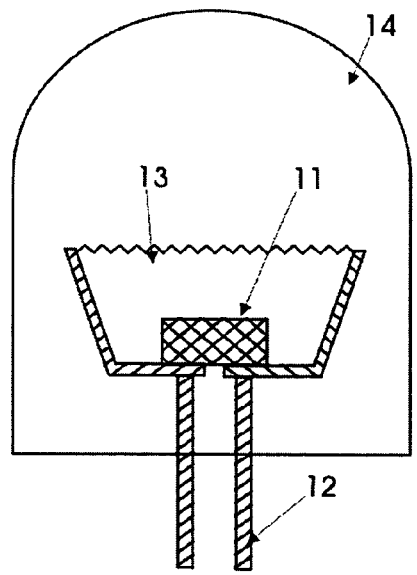
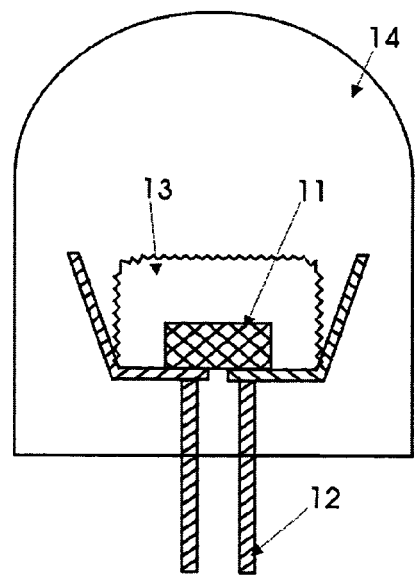

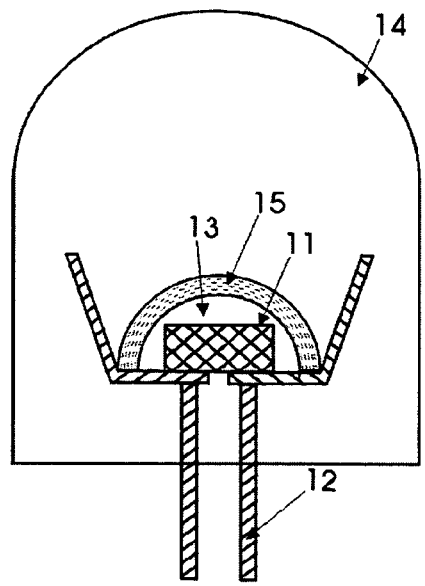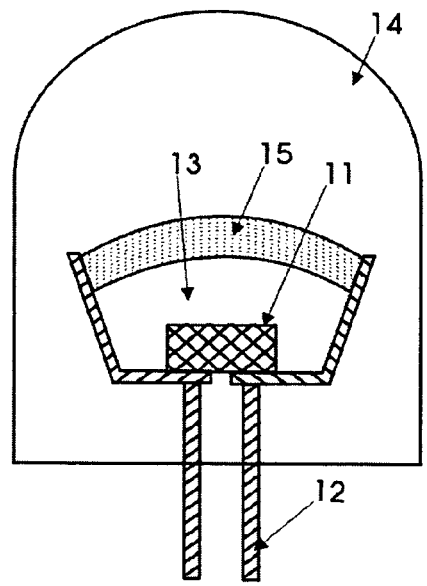
Figs 4
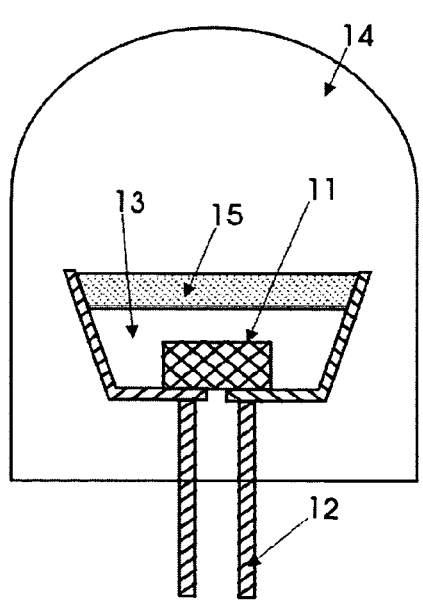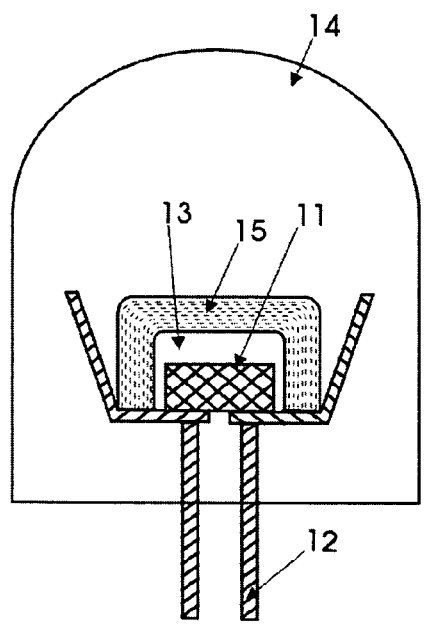

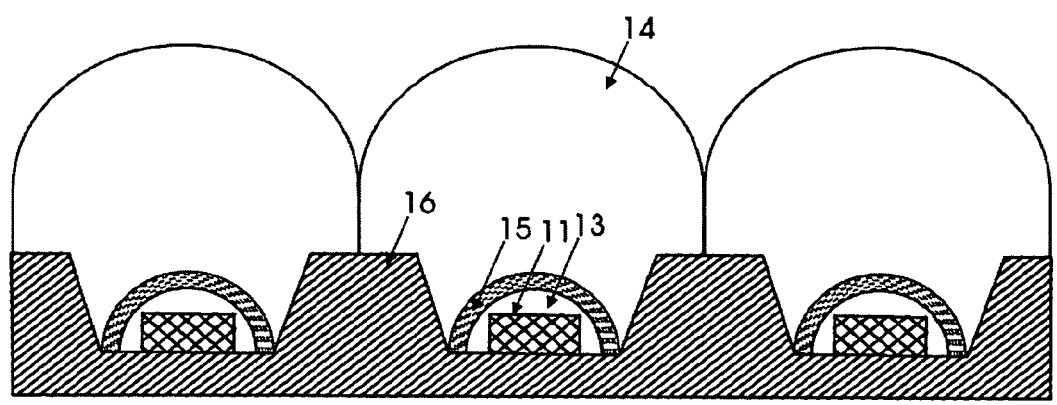
Figs 6
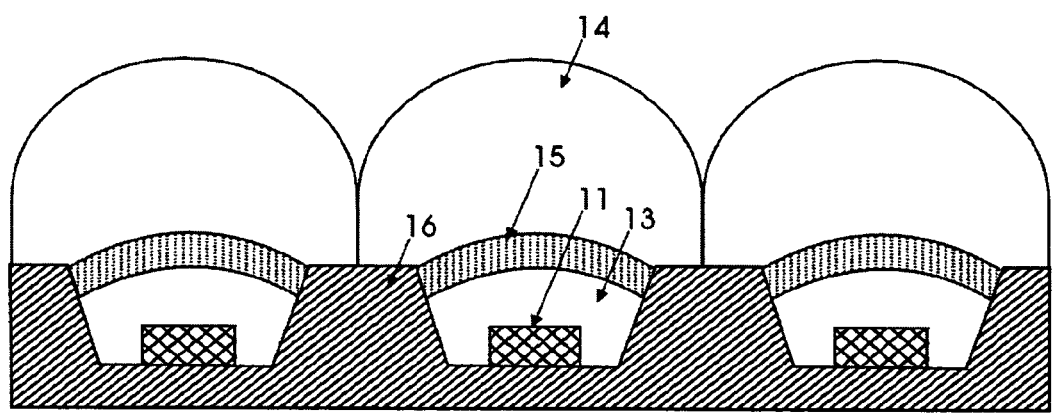

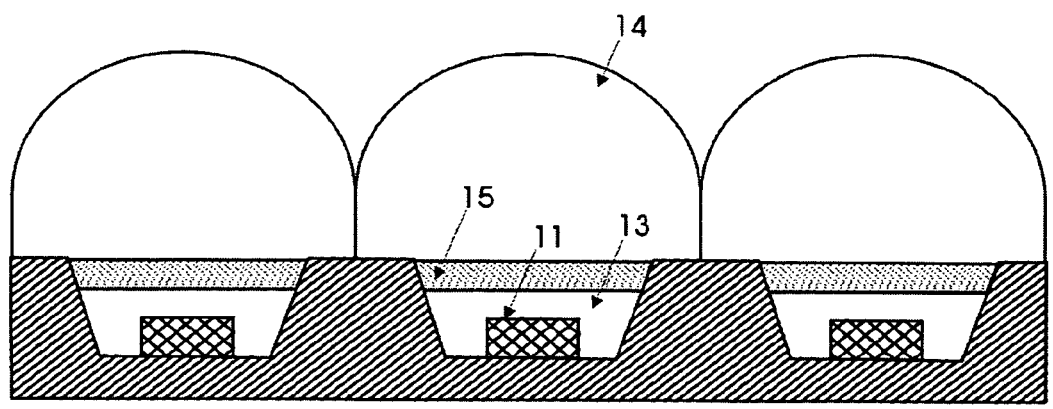
Figs 7
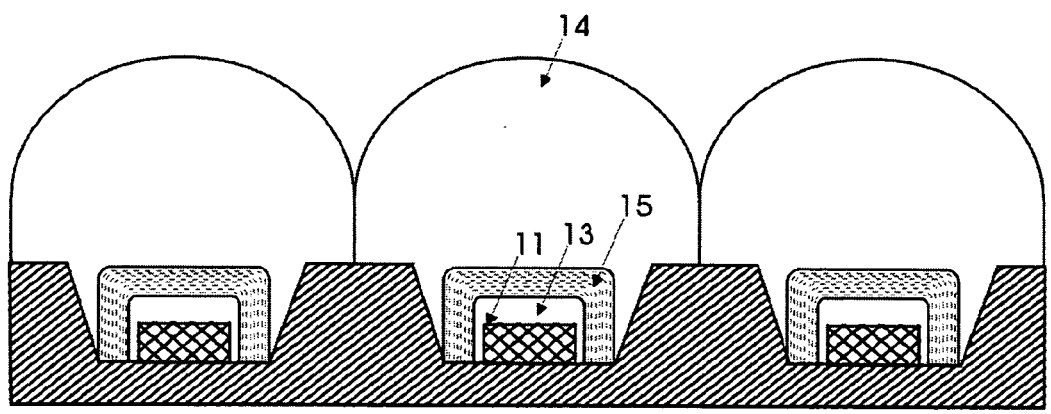

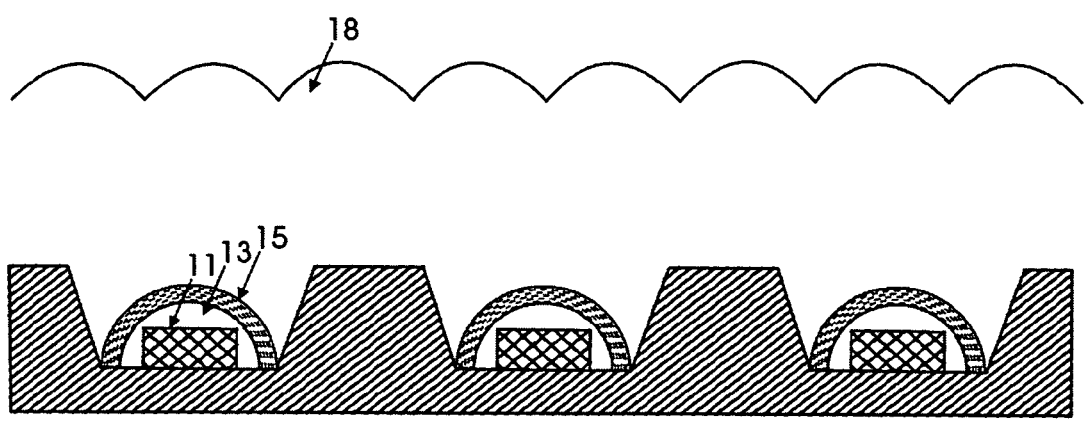
Figs 8
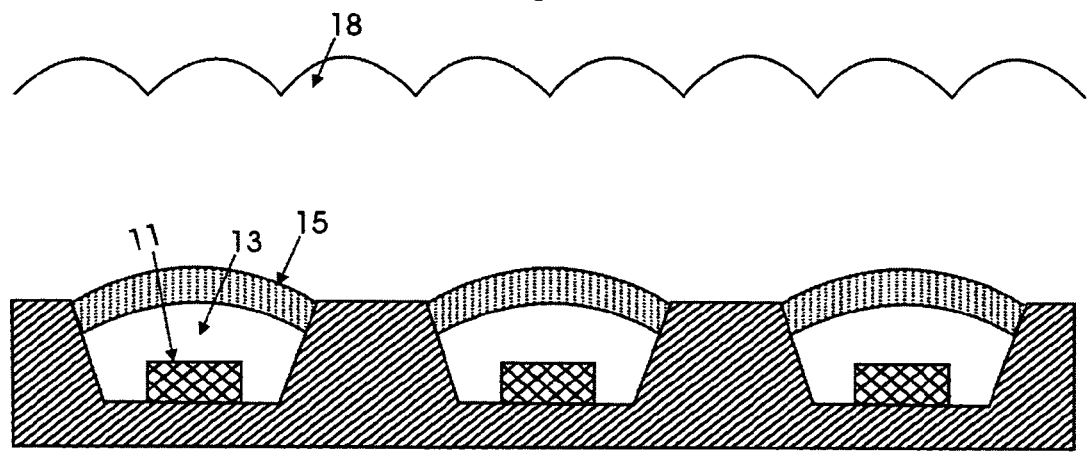

NANOCOMPOSITE PHOTONIC STRUCTURES FOR SOLID STATE LIGHTING

REFERENCE TO RELATED APPLICATIONS

This application is a continuation in part of U.S. patent application Ser. No. 10/299,410 filed Nov. 19, 2002 now U.S. Pat. No. 6,734,465 which in turn claims the priority of U.S. Provisional patent application Ser. No. 60/331,683 filed Nov. 19, 2001 and U.S. Provisional patent application Ser. No. 60/379,726 filed May 10, 2002.

BACKGROUND AND SUMMARY OF THE INVENTION

This invention relates generally to solid state lighting applications and specifically to high refractive index (HRI) nanocomposites including phosphors suitable for excitation by Light Emitting Diodes (LED's) and photonic lighting devices based thereon.

Because of their energy efficiency, LED's have recently been proposed for lighting applications, particularly for specialty lighting applications, where energy inefficient incandescent and halogen lights are the norm. To date, three main approaches have been taken to provide so called "white" light from LED's. The first approach uses clusters of red, green and blue (RGB) LED's, with color mixing secondary-optics, to produce white light. This approach does provide good quality white light with a "color rendering index" (CRI) of ~85 and is energy efficient, however, the need to drive three separate sets of LED's requires complex and more expensive driver circuitry. The complexity arises due to considerably different extent of degradation in efficiency with increasing temperature, for each of the red, green and blue LEDs and to different degradation lifetimes between the red, green and blue LEDs. Furthermore, high-brightness (5 mW to 1000 mW LED lamp) blue and green LED's have only recently been developed and are expensive when compared to red LED's.

A second approach to the generation of white light by LED's is the use of a high-brightness blue LED (450 nm to 470 nm) to energize a yellow phosphor, such as Yttrium aluminum garnet doped with cerium (YAlG:Ce called "YAG"). While this approach is energy efficient, low cost and manufacturable, it provides a lower quality white light with color temperature (CT) of ~7000 K and CRI of ~70 to 75, which is not acceptable for many high quality applications. The use of a thicker phosphor layer to absorb and down-convert more of the blue emission, can lower the color temperature and thereby improve the quality of white light. However, this results in a lower energy efficiency. Alternately, using a single or multiple phosphors with red emission in addition to yellowish-green (or greenish-yellow) emission can increase the color rendering index and thereby improve the quality of white light yielding a CT of ~4000 K and CRI of ~80 to 85 but with lower energy efficiency. However, optical efficiency of the phosphor containing package is only about 50%, resulting in decreased light extraction in each of the above cases.

A third approach to the generation of white light by LED's is the use of a high-brightness UV/violet LED (emitting 370-430 nm radiation) to energize RGB phosphors. This approach provides high quality white light with CRI of ~90 or higher, is low cost and is reliable to the extent that the encapsulant in the package, containing/surrounding the phosphor and LED chip/die does not degrade in the presence of UV/violet emission. This is due to shorter degradation lifetimes and a larger decrease in efficiency with increasing ambient temperature, for red LED chips compared to UV/violet or blue LED chips, which leads to greater color-maintenance problems and requires more complex driver circuitry. However, at present this approach has very poor efficiency because of the poor light conversion efficiency of the UV/violet excitable RGB phosphors currently in use. In addition, the optical efficiency of the phosphor containing package is only about 50%, resulting in a further decrease in light extraction.

The present invention is directed to a photonic structure for "white" light generation by phosphors under the excitation of a LED. The photonic structure mounts the LED and an optically transparent nanocomposite matrix having dispersed therein phosphors which will emit light under the excitation of the radiation of the LED. The phosphors dispersed in the matrix may be nanocrystalline or larger sized with the addition of non light emitting, non light scattering nanoparticles dispersed within the matrix material so as to raise the index of refraction of the matrix material to that of the phosphors. The nanocomposite matrix material may be readily formed by molding and formed into a variety of shapes including lenses for focusing the emitted light. A large number of the photonic structures may be arranged on a substrate to provide even illumination or other purposes.

The present invention provides:

A High refractive index (>1.7, ~1.9), optically clear, transfer moldable encapsulating lens Dimensions larger than ~0.1 cm are achievable Encapsulation of InGaN (Blue/violet/green)& AlInGaP (red/yellow) saturated color LED dies.

Encapsulation of white LED lamps containing an InGaN LED die and conventional phosphors

BRIEF DESCRIPTION OF THE DRAWINGS

For a better understanding of the invention, reference is made to the following drawings which are to be taken in conjunction with the detailed description to follow in which:

FIGS. 2, 3 and 4 of the drawings illustrate additional configurations of a light emitting device constructed in accordance with the present invention, using nanocomposite downconverters;

FIGS. 5, 6, 7, 8 and 9 of the drawings illustrate additional configurations of a light emitting device, constructed in accordance with the present invention, implemented on a substrate containing a multiplicity of individual LED modules.

DESCRIPTION OF THE PREFERRED EMBODIMENTS

Modalities of Operation

The present invention is applicable to various modalities of LED/phosphor operation including: a blue LED with a yellowish (or RG) phosphor; RGB phosphors with a UV LED and deep UV LED with "white" fluorescent tube type phosphors. The invention is also applicable to use with various sizes of phosphors: "bulk" micron sized phosphors, nanocrystalline phosphors ("nanophosphors")—less than 100 nm in average diameter and more preferably less than 40 nm) and the newly developed Quantum Confined Atoms (QCA) based nanophosphors which have average diameters of less than 10 nm, which are explained in detail in U.S. patent application Ser. No. 10/436,289 filed May 12, 2003 (the disclosure of which are hereby incorporated by reference).

Bulk phosphors are efficient when their phosphor-grain size exceeds 1 um. Nanophosphors can exist in the form of individual nanoparticles (<10 nm) and can also exist in the form of optically-nonscattering agglomerates (<40 nm), comprised of individual nanoparticles, provided their efficiency is not compromised by agglomeration. Nanophosphors can also exist in the form of optically scattering (>40 nm) micron sized agglomerates comprised of individual nanoparticles, comparable in size to bulk phosphors.

The present invention encapsulates the phosphors in an optically transparent matrix which is important for providing efficiency. The conditions (for a matrix or encapsulant) for achieving a transparent downconverter are as follows: when Nanophosphors are present as individual nanoparticles in a matrix there is no restriction on the refractive index (RI) of the matrix. When Nanophosphors are present as optically-nonscattering agglomerates in a matrix there is also no restriction on the refractive index of the matrix. When Nanophosphors are present as optically scattering agglomerates in a matrix this requires a matrix material with an RI equal to that of agglomerate's average RI. Bulk phosphors require a HRI matrix with the RI value approaching very close to that of the phosphor ($RI_{PHOSPHOR} - RI_{MATRIX} < 0.15$), for example an RI of approximately 1.8. which can be achieved with the addition of non light emitting, non light scattering nanoparticles dispersed within the matrix material so as to raise the index of refraction of the matrix material to close to or equal that of the phosphors.

Representative Examples of Photonic Devices

Figure 1:
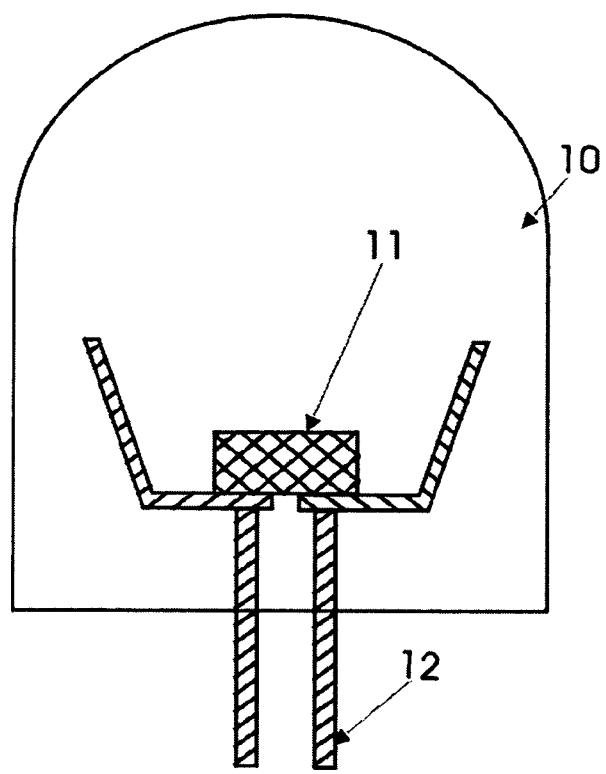
FIG. 1 of the drawings illustrates a first configuration of a light emitting device constructed in accordance with the present invention, using a nanocomposite downconverter.

In all of the examples described below, the volume concentration of phosphors may or may not be spatially varied in the nanocomposite downconverter. FIG. 1 of the drawings illustrates a first embodiment of a light emitting device constructed in accordance with the present invention, in which a nanocomposite downconverter 10 formed from the matrix materials described above is molded as a lens, and a metal lead-frame with reflector cup 12 mounts an LED chip 11. Lead frame 12 thus serves as a electrical connection as well as a reflector. FIGS. 2 and 3 of the drawings illustrates further embodiments of a light emitting device with the same reference numbers used to indicate like structure. In the embodiments of FIGS. 2 and 3 a nanocomposite downconverter 13, in a variety of configurations, is disposed within lead frame 12 with a molded epoxy or conventional encapsulant lens 14 which does not contain the phosphor materials, which may be a high refractive index composite. In the embodiments shown in FIG. 4 nanocomposite downconverter 13 is covered with a graded refractive index layer 15 which may incorporate micro-optical elements and sub-wavelength sized photonic bandgap structures, to achieve enhanced light extraction and enhanced directionality for the visible light emission (by suppressing wave-guiding in downconverter 13).

Figure 5:
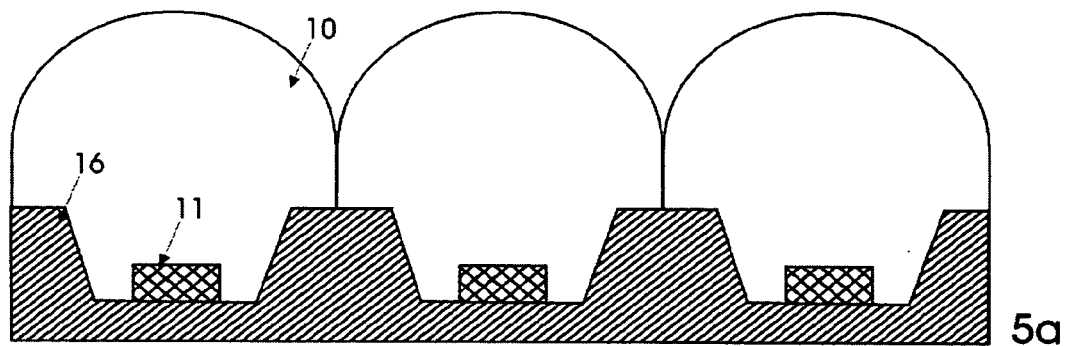
Figure 5:
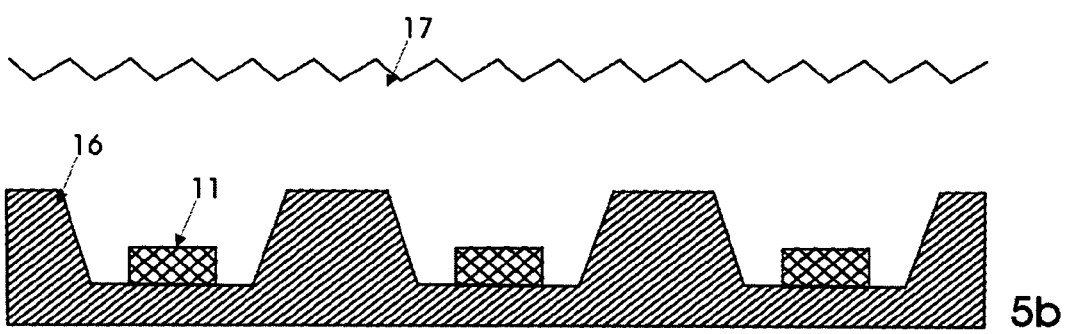
Figure 5:
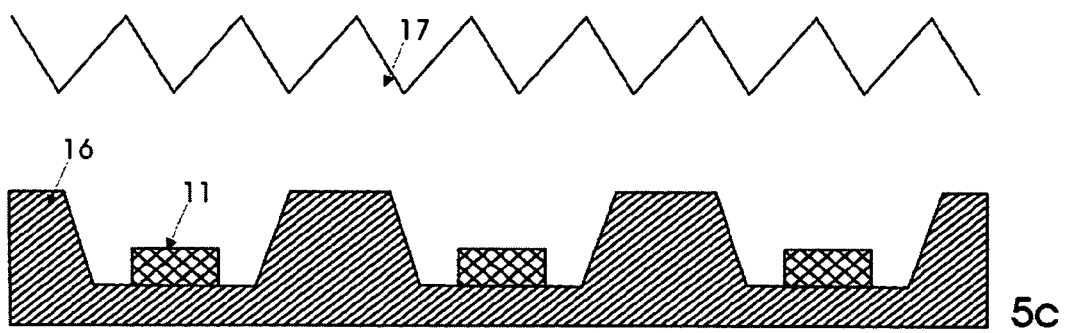

The following drawings make clear that the light emitting devices of the present invention maybe implemented on a substrate containing a multiplicity of individual LED modules. In FIG. 5a a substrate 16 with reflective cavities and a reflective surface mounts LED chips 11, surrounding each chip 11 is a nanocomposite downconverter 10 molded as a lens which is formed from the matrix materials described above. In FIGS. 5b and 5c substrate 16 mounting LED chips 111 is covered with nanocomposite downconverters 17 with microoptics formed in the upper surface. In FIGS. 6 and 7 each LED chip 11 mounted on substrate 16 is surrounded by nanocomposite downconverter 13 which in turn is covered with graded refractive index layers 15 which can incorporate micro-optical elements and/or photonic bandgap structures in a variety of configurations.

Figure 9:
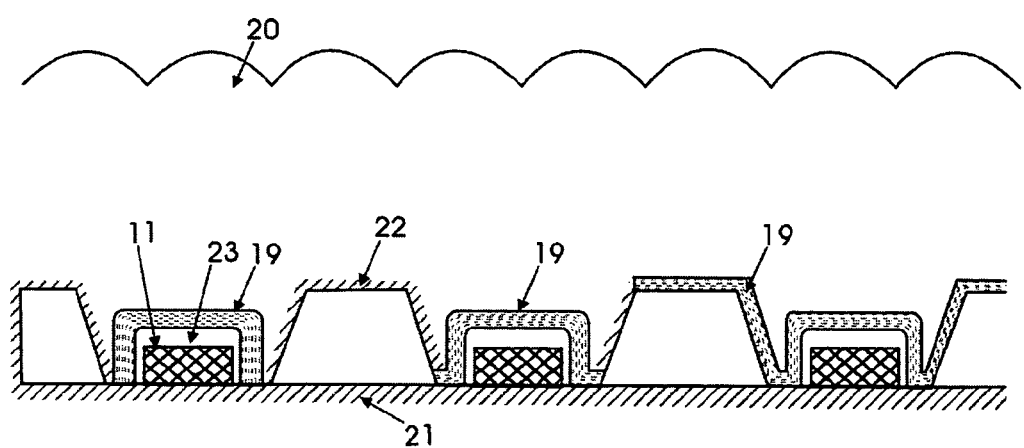

In FIG. 8 substrate 16 mounting LED chips 11 is surrounded by nanocomposite downconverters 13 which are covered with a graded refractive index layer 15 and epoxy or conventional encapsulant lenses 18 with microoptics molded therein which may be a high refractive index composite. In FIG. 9 a substrate 21 with a reflective surface has a reflective coating 22, mounted in the wells of substrate are LED chips 11 which are surrounded by a high refractive index material 23 and thereafter with a coating 19 to prevent visible light and LED emissions from reentering chip 11. A molded nanocomposite downconverter 20 having microoptics and optical coatings forms the upper layer of the completed package.

In FIGS. 4, 6, 7, and 8, the following variations may also be implemented: The Nanocomposite downconverter 13 and the graded refractive index layer 15 which may incorporate microoptical elements and sub-wavelength sized photonic bandgap structures, may be interchanged such that the downconverter is not in physical contact with the LED chip. An optically transparent layer that does not emit light, but which may be a high refractive index material layer, such as 23 in FIG. 9, could be placed between the downconverter 13 and the LED chip. A coating to prevent visible light and LED emissions from reentering the chip, such as 19 in FIG. 9, may be placed in between the downconverter 13 and the LED chip, or in between the downconverter 13 and the optically transparent high refractive index layer such as 23 in FIG. 9 in contact with the LED chip.

Integration of Phosphor Based Optically Non-Scattering Downconverters with LED Die/Chip Packages The phosphors and non light emitting, non light scattering nanoparticles are dispersed in an optically transparent matrix material, to fabricate the downconverter, which encapsulates the LED die/chip.

The matrix material is transparent in both the UV-Visible excitation and the Visible emission wavelength regime. The refractive index of the matrix material is at least 1.4 or higher. The matrix material does not exhibit degradation of optical transparency, due to darkening or discoloration, after prolonged exposure to the UV-Visible excitation. Suitable matrix materials include, but are not limited to: Epoxy, Silica (SiOx), SiOx with a polymer such as PMMA and/or MMA, Alumina (AlOx), Silicone and a Silicone-Epoxy hybrid.

In addition to the light emitting phosphor particles, index matching, non light emitting, non light scattering nanoparticles are also incorporated into the matrix material. Such non light emitting, non light scattering nanoparticles, such as but not limited to zirconia; titania and group 2 chalcogenides, which can have refractive indexes of 2.0 or more will serve to raise the effective refractive index of the matrix to 1.7 or greater, which will increase the light output from the matrix even though these nanoparticles or their agglomerates (less than 40 to 30 nm in size) do not themselves emit light. The high refractive index, non light emitting, non light scattering nanoparticles may be dispersed in relatively large quantities (20 to 50% by volume) in the matrix without turning the matrix opaque since the size of the nanoparticles is smaller than the wavelengths of the emitted light and are thus "invisible" to the light. The volume % of the light emitting particles can be up to approximately 40%.

For a bulk phosphor based downconverter, close matching of the refractive index values of the bulk phosphor and the HRI encapsulant (i.e. a transparent matrix with non light emitting non light scattering nanoparticles dispersed in it) results in an optically non-scattering downconverter.

Nanophosphor particles that are smaller than 10 nm in size, which is more than an order of magnitude smaller than both the excitation and emission wavelengths, can be dispersed in the matrix without agglomeration by the use of functional-group coating or coupling agent such as an alkyloxysilane solution applied to the nanophosphor particles. Note also that a functional-group coating or coupling agent is also applied to the non light emitting, non light scattering nanoparticles. The electrostatic compatibility between the functional-group coating on the nanoparticles and the matrix material, enables dispersion of the nanoparticles in the matrix without agglomeration. This dispersion of the non light emitting, non light scattering nanoparticles and nanophosphor particles in the matrix imparts an optical transparency to the downconverter. Even in the event that the Nanophosphor particles are agglomerated, but the size of the agglomerate is less than 40 to 30 nm, the downconverter will remain optically transparent.

The refractive index of the nanophosphor particles is typically higher than 2.0. The effective refractive index of the downconverter is higher than that of the matrix material and depends on the fractional volume concentration of the nanophosphor and the non light emitting, non light scattering high refractive index nanoparticles. The spatial profile of the refractive index can be adjusted, by appropriately varying the volume concentration of the non light emitting, non light scattering nanoparticles and nanophosphor particles, to enhance light extraction from the LED die/chip.

The phosphor particles, the non light emitting, non light scattering nanoparticles and the matrix material coexist as a dispersed composite gel or liquid, prior to being converted into a solid phase, for example, by thermal curing or by photoactivated curing. The required temperature range for the curing process is compatible with the thermal budget of the packaging process. Alternately, the composite comprised of the matrix material with phosphor and non light emitting, non light scattering nanoparticles dispersed in it, can remain as a compliant composite gel or liquid and offer some advantages with respect to its ability to withstand higher operating temperatures in a package containing components with mismatched thermal expansion coefficients. "Self-organization" effects can also be initiated and harnessed in this composite gel or liquid to obtain sub-wavelength sized photonic bandgap structures in the downconverter.

The following approaches can be undertaken to integrate the downconverter with the LED die/chip in a package: To encapsulate a LED die/chip in a nanocomposite downconverter, the composite gel or liquid can be dispensed over the die mounted in a reflector cup and either fully or partially cured, similar to the process in which an Amine-cured or Anhydride-cured epoxy is used, to form an encapsulating lens. Alternately, the approach outlined in 1) can be implemented with an individual "lens" for each die or a "single lens" encapsulating the entire array.

In the case of a close-packed array of LED die/chip mounted on a substrate for superior heating sinking and electrical connections in high-lumen applications, the composite gel or liquid can be spin-coated and either fully or partially cured to obtain a conformal coverage of the downconverter on each die/chip in the array. This could be done with or without patterning the downconverter coating, implemented using a lift-off masking layer prior to coating the composite gel or liquid, or in case of a photocurable composite gel or liquid implemented using a photomask.

The composite gel or liquid can be molded and cured to form a "cap" structure incorporating micro-optical elements and 2-dimensional sub-wavelength sized photonic bandgap structures implemented using nano-imprinting techniques, to achieve enhanced light extraction and enhanced directionality for the visible light emission (by suppressing wave-guiding in the downconverter).

The optical elements in the structure such as for example, coatings or layers on top of the downconverter and in between the downconverter and die/chip, can also serve the purpose of enhancing the confinement of the UV-Blue excitation within the downconverter, to achieve enhanced absorption efficiency for the excitation and minimize the amount of phosphor-downconverted visible emission entering the die/chip. Alternately, the coatings or layers between the downconverter and die/chip can also serve the purpose of preventing the excitation from re-entering the die/chip, after it has been reflected back towards the die/chip by the coating on top of the downconverter. These coatings or layers may or may not contain sub-wavelength sized photonic-bandgap structures.

The molded structure with a cavity closely matched (but slightly larger) to the die/chip dimensions, would be fitted as a "cap" on top of a die/chip. For a close-packed array of LED die/chips, the molded structure can incorporate an array of cavities, closely matched to the LED die/chip pattern on the underlying substrate. Optical coupling between the LED die/chip and the downconverter is achieved by dispensing a controlled volume of the high refractive index composite gel or liquid on top of the die/chip followed by insertion of the "cap" and curing of the composite gel or liquid (provided there is no volume shrinkage upon curing) or alternately, using an uncured composite gel or liquid. An higher refractive index composite comprising Silicone which does not darken under UV Blue excitation and non light emitting, non light scattering higher refractive index nanoparticles dispersed in it, can be used for optical coupling.

A more advanced version of the molded "cap" structure described above can incorporate photonic bandgap structures, such as a 2D multilayer stack comprised of dielectric layers with differing indices of refraction or 3D lattice structures whose indices of refraction differ from the matrix material, to enhance absorption of the UV-Blue excitation and enhance directionality and light extraction of the visible emission. These sub-wavelength structures can be realized using "self-organization" effects amongst the non light emitting, non light scattering nanoparticles and Nanophosphor particles in the matrix material. This would decrease the requirements of additional process steps such as nano-imprinting and molding/machining of the micro-optical elements. A downconverter with integrated optical elements and photonic bandgap structures can enable reduced form-factor packages with a higher lumen output per unit area, due to the reduced complexity of the primary optics in the package.

The high refractive index composite gel or liquid can be injected into a package to fill in the volume between the LED die/chip and an optically clear encapsulating hollow shell or lens. The shell which serves to physically contain the high refractive index composite gel or liquid and is capable of retaining its shape. The shell could be composed of, but not limited to, glass, acrylate, epoxy, silicone and silicone-epoxy hybrid.

Performance Enhancement Offered by Optically Non-Scattering luminescent Downconverter At the present time, the conventional bi-phosphor or tri-phosphor blends synthesized for white-light generation with UV-Violet excitation around 400 nm, have a luminous equivalent of ~375 to 350 lm/W based on the spectral characteristic of the phosphor emission.

These conventional phosphors which have been engineered for 400 nm excitation, do not simultaneously exhibit both high Absorption Efficiency (A. E) and high Quantum Efficiency (Q. E). For example, for phosphors with Q. E ~90% the measured A. E ~50% to 60%. This is in contrast to desired A. E values in the 80% to 90% range.

As a consequence of the low absorption, in order to prevent the wasteful "bleed-through" of the unabsorbed 400 nm excitation, the thickness of the conventional phosphor-blend layer around the LED die/chip is larger than what is optimal from a light extraction standpoint. The thicker phosphor layer leads to higher scattering of the visible emission by the phosphor particles, resulting in the absorption of a larger fraction of the visible emission at lossy surfaces in the die/chip or package. The lower transparency of the thicker phosphor layer, due to scattering, results in a smaller light extraction efficiency for the visible emission. The optical efficiency of the package, resulting from the scattering, non-transparent phosphor downconverter layer is about 50%.

Luminous Efficacy values around 1.2 lm/W per 1% LED lamp wall plug efficiency (30 lm/W for 25% LED lamp wall plug efficiency), have been observed using conventional phosphor blends engineered and coupled to 400 nm LEDs. This implies package optical efficiency values around 50%. Package optical efficiency values around 85% are routinely achieved using thinner phosphor layers (4 to 5 particles thick) for phosphors with higher A. E for 254 nm and e-beam cathodoluminescent excitation.

The high optical transparency of the nanocomposite downconverter for the visible emission enables a high package optical efficiency, with values around 90% being achievable. This is in conjunction with an additional die/chip light extraction efficiency improvement of 30% to 50% depending on the geometry and optical design of the die/chip, due to encapsulation of the die/chip by a higher refractive index material (For increasingly advanced optical designs of future generation die/chip's this increase may be less pronounced. However if higher performance of future generation die/chip's is entirely based on improvements in the semiconductor material, then the extent of the above improvement is still valid) and the absence of scattering by the phosphor particles which enables A. E in the 80% to 90% range, results in Luminous Efficacy values around ~3.5 lm/W per 1% excitation LED lamp wall plug efficiency. This would result in 90 lm/W from the currently available 25% wall plug efficient excitation LED lamp. This is more than a 100% improvement.

Luminous Efficacy values around 1.8 lm/W per 1% excitation LED lamp wall plug efficiency (45 lm/W for 25% excitation LED lamp wall plug efficiency), have been observed using conventional phosphor blends engineered and coupled to 470 nm LEDs. This implies package optical efficiency values around 50% for the package. Enhanced package optical efficiency values around 90% should be achievable, due to a transparent downconverter. A die/chip light extraction efficiency improvement of 30% to 50% is anticipated depending on the geometry and optical design of the die/chip, due to incorporation of the higher refractive index material in immediate vicinity of the die/chip (For increasingly advanced optical designs of future generation die/chip this increase could be less pronounced. However if higher performance of future generation die/chip is entirely based on improvements in the semiconductor material, then the extent of the above improvement is still valid) The enhanced package optical efficiency in conjunction with the enhanced die/chip light extraction efficiency results in a luminous efficacy value of ~3.5 lm/W per 1% excitation LED lamp wall plug efficiency. This would amount to 90 lm/W from the currently available 25% wall plug efficient excitation LED lamp. This is ~100% enhancement in the luminous efficacy of the lamp.

Figure 10:
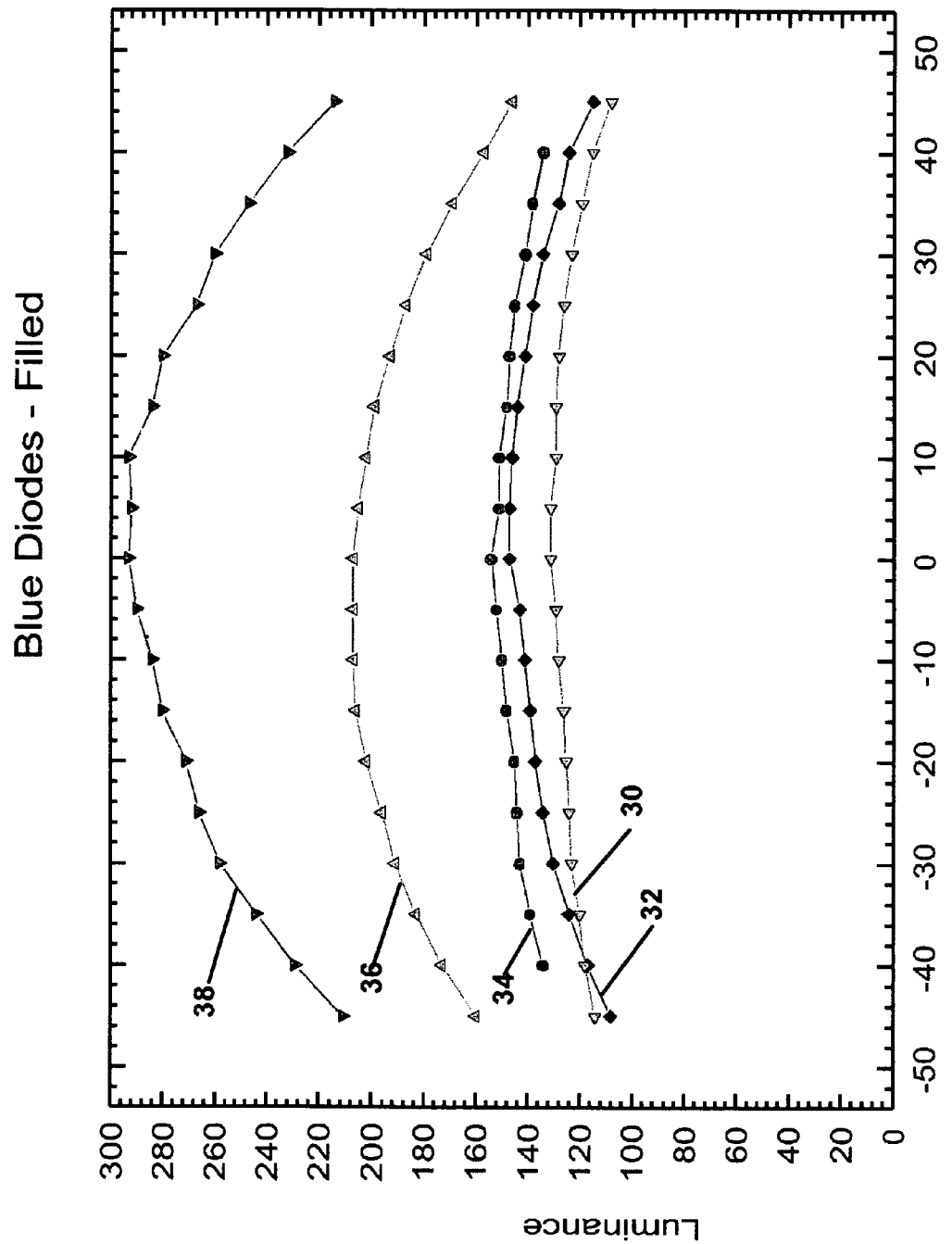
FIG. 10 is a chart depicting the angular dependence of relative luminous intensity of various samples of LED structures with a HRI nanocomposite encapsulant as compared to a conventional encapsulant.

FIG. 10 is a graph depicting the angular dependence of luminous intensity (measured in relative Candela units) for a YAG:Ce based white-light top-emitting SMD (Surface Mount Device) lamps with a HRI nanocomposite encapsulant (samples 36, 38) versus YAG:Ce based white-light top-emitting SMD lamps with conventional encapsulants (samples 30, 32, 34) all using a 460 nm wavelength (blue) LED chip. The blue light emitted by the LED chip is partially converted to yellow by the YAG:Ce bulk sized phosphors the blue and yellow light combine to from a "white" light emission. The conventional encapsulant has a RI=1.54 while the HRI encapsulant has a RI>1.7 achieved by the addition of non light emitting, non light scattering nanoparticles to the matrix with the phosphors to form a nanocomposite encapsulant. The conventional encapsulant can be an Epoxy based resin, either Cyclo-Aliphatic or Cyclo-Aromatic in nature. The conventional encapsulant with RI=1.54 in the present case, is an Anhydride-cured epoxy and is a mixture of both the Epoxy resins listed above. The HRI encapsulant is a comprised of high refractive index titanium oxide-nanoparticles with a functional-group coating, dispersed in a conventional encapsulant matrix.

The ratio of Blue to Yellow peak-intensity values in the on-axis spectra (listed as B:Y in table A below) which determine the color "temperature" (or chromaticity coordinate) of the white-light emission, depend on the YAG:Ce phosphor loading in the lamp. The B:Y value decreases with increasing YAG:Ce phosphor loading for both the HRI and conventional encapsulant. Identical phosphor loading (ie. mg/cm$^2$) in both the HRI and conventional encapsulant may not result in the same B:Y. The B:Y values are listed below:

TABLE A

| Sample 38 | (RI > 1.7) | B:Y = 1.6:1 | Total Int. Val = 1848 |
|---|---|---|---|
| Sample 36 | (RI > 1.7) | B:Y = 2.5:1 | Total Int. Val = 1394 |
| Sample 30 | (RI = 1.54) | B:Y = 1.8:1 | Total Int. Val = 892 |
| Sample 32 | (RI = 1.54) | B:Y = 3.2:1 | Total Int. Val = 960 |
| Sample 34 | (RI = 1.54) | B:Y = 1.2:1 | Total Int. Val = 850 |

Both the HRI and Conventional encapsulant based lamps cover an overlapping range of B:Y values ie. similar color of white-light emission.

The "Total Int. Val." corresponds to value obtained after integration of the measured Candela output over the corresponding solid-angles and is thus proportional to the total luminous flux (ie Lumens) from each lamp, emitted over the measured range of angles. The nanocomposite HRI based lamps (36,38) exhibit at least 40% higher optical power compared to the conventional encapsulant based lamps (30,32,34), for similar color of white-light emission. Thus at least 40% improved light emission results from the use of the nanocomposite HRI encapsulant compared to the conventional encapsulant with the same LED and without increasing the electrical input to the lamp.

In addition to YAlG:Ce other suitable metal oxide hosts for use the present invention include terbium aluminum garnet doped with cerium (TbAlG:Ce), yttrium oxide ($Y_2O_3$), zirconium oxide ($ZrO_2$), zinc oxide (ZnO), titanium oxide ($TiO_2$), silicon dioxide ($SiO_2$), gadolinium oxide ($Gd_2O_3$), praseodymium oxide ($Pr_2O_3$), lanthanum oxide ($La_2O_3$), lutetium oxide ($Lu_2O_3$), scandium oxide ($Sc_2O_3$), samarium oxide ($Sm_2O_3$), aluminum oxide ($Al_2O_3$), boron oxide ($B_2O_3$), gallium oxide ($Ga_2O_3$), indium oxide ($In_2O_3$), magnesium oxide (MgO), calcium oxide (CaO), strontium oxide (SrO), barium oxide (BaO) and copper oxide and their alloys. Suitable dopants include the rare earth elements, (dysprosium, ytterbium, europium, terbium, thulium, cerium, gadolinium, holmium, samarium and neodymium). The transition metals (manganese, copper, silver, cobalt, nickel, niobium, zirconium, and iron) may also be used as activators for various applications.

The invention has been described with respect to preferred embodiments. However, as those skilled in the art will recognize, modifications and variations in the specific details which have been described and illustrated may be resorted to without departing from the spirit and scope of the invention.

What is claimed is:

1. A photonic structure for emission of white light under excitation by an LED, comprising:
   a) a radiation emitting diode, emitting light of a first wavelength
   b) an optically transparent matrix material disposed so as to intercept the light emitted by said diode;
   c) phosphors dispersed within said matrix material, that will emit light of a second wavelength upon excitation by the radiation of the diode; and
   d) non light emitting, non light scattering nanoparticles dispersed within said matrix material so as to raise the index of refraction of the matrix material to match the index of refraction of the phosphors dispersed within the matrix material.

2. The photonic structure as claimed in claim 1 wherein the optically transparent matrix material surrounds said diode.

3. The photonic structure as claimed in claim 1 wherein the matrix material is selected from the group consisting of: epoxy, silica, silica with a polymer, alumina, silicone and silicone-epoxy hybrids.

4. The photonic structure as claimed in claim 1 further including a substrate to which multiple diodes are mounted.

5. The photonic structure as claimed in claim 1 wherein the diodes and the matrix are disposed within a light reflector.

6. The photonic structure as claimed in claim 1 wherein the diodes emit 370-470 nm radiation.

7. The photonic structure as claimed in claim 1 wherein the phosphors comprise separate phosphors that emit red, green and blue light upon excitation by the radiation of the diode.

8. The photonic structure as claimed in claim 1 wherein the diode is at least one of a blue emitting diode and a UV emitting diode.

9. The photonic structure as claimed in claim 1 wherein the phosphors comprise at least one of: yttrium aluminum garnet doped with cerium and terbium aluminum garnet doped with cerium.

10. The photonic structure as claimed in claim 1 wherein the diode is a blue emitting diode.

11. The photonic structure as claimed in claim 1 further including a reflector disposed proximate to at least one of said radiation emitting diode and said optically transparent matrix material.

12. The photonic structure as claimed in claim 1 wherein said reflector also functions as an electrical connection to said radiation emitting diode.

13. The photonic structure as claimed in claim 1 wherein the diode and the phosphors comprise complementary colors.

14. The photonic structure as claimed in claim 1 wherein the phosphors comprise multiple wavelength phosphors.

15. The photonic structure as claimed in claim 1 wherein the optically transparent matrix material has an index of refraction of greater than 1.7.

16. A photonic structure for emission of white light under excitation by an LED, comprising:
   a) a substrate;
   b) a plurality of radiation emitting diodes, disposed on said substrate;
   c) an optically transparent matrix material disposed so as to intercept the light emitted by said diodes; and
   d) phosphors dispersed within said matrix material, that will emit light upon excitation by the radiation of the diodes;
   e) non light emitting, non light scattering nanoparticles dispersed within said matrix material so as to match the index of refraction of the matrix material to that of the phosphors.

17. The photonic structure as claimed in claim 16 wherein the matrix material is selected from the group consisting of: epoxy, silica, silica with a polymer, alumina, silicone and silicone-epoxy hybrids.

18. The photonic structure as claimed in claim 16 wherein the optically transparent matrix material has an index of refraction of greater than 1.7.

19. The photonic structure as claimed in claim 16 wherein the diodes and the phosphors comprise complementary colors.

20. The photonic structure as claimed in claim 16 wherein at least one of the diodes is a blue emitting diode.

21. The photonic structure as claimed in claim 16 wherein the non light emitting, non light scattering nanoparticles are selected from the group consisting of zirconia; titania and group 2 chalcogenides.

22. The photonic structure as claimed in claim 16 wherein the non light emitting, non light scattering nanoparticles are less than 40 nm in size.

23. The photonic structure as claimed in claim 16 further including a molded lens which does not include nanoparticles.

24. The photonic structure as claimed in claim 16 further including a layer of transparent material having a graded index of refraction.

* * * * *